(12) United States Patent
MacDonald et al.

(10) Patent No.: US 6,170,784 B1
(45) Date of Patent: Jan. 9, 2001

(54) CABLE MANAGEMENT DEVICE

(75) Inventors: Ian MacDonald, Belcarra; Eric Graham, Richmond, both of (CA)

(73) Assignee: Polygon Wire Management, Inc., Port Coquitlam (CA)

( * ) Notice: Under 35 U.S.C. 154(b), the term of this patent shall be extended for 0 days.

(21) Appl. No.: 09/099,904

(22) Filed: Jun. 18, 1998

(51) Int. Cl.$^7$ ........................................... F16L 3/08
(52) U.S. Cl. ..................... 248/65; 248/68.1; 248/74.3; 211/26; 379/438
(58) Field of Search ............... 248/65, 68.1, 49, 248/58, 59, 70, 73, 74.3, 57, 909; 211/26, 103; 174/65 R, 72 A, 68.1, 68.3, 101; 379/438, 399, 326; 361/826, 827, 752, 796, 823, 828

(56) References Cited

U.S. PATENT DOCUMENTS

| D. 409,896 | 5/1999 | Kaplan | D8/356 |
|---|---|---|---|
| 2,189,993 | * 2/1940 | Ramsey | 211/26 |
| 2,920,244 | * 1/1960 | Miksit et al. | 211/26 X |
| 3,633,857 | * 1/1972 | Logan | 248/68.1 X |
| 3,787,016 | * 1/1974 | Laval, Jr. | 248/68.1 X |
| 3,923,277 | * 12/1975 | Perrault et al. | 248/68.1 X |
| 4,641,754 | * 2/1987 | Hebel et al. | 211/26 |
| 5,390,883 | * 2/1995 | Songhurst | 248/74.3 |
| 5,396,405 | * 3/1995 | Reed et al. | 361/827 |
| 5,548,489 | * 8/1996 | Reed et al. | 361/827 |
| 5,571,256 | * 11/1996 | Good et al. | 211/26 |
| 5,593,115 | * 1/1997 | Lewis | 248/68.1 |
| 5,788,087 | * 8/1998 | Orlando | 211/26 |
| 5,839,702 | * 11/1998 | Jette | 248/68.1 X |
| 5,845,882 | * 12/1998 | Hodges et al. | 248/59 |
| 5,918,837 | * 7/1999 | Vicain | 248/49 |
| 5,929,381 | * 7/1999 | Daoud | 174/72 A |

* cited by examiner

*Primary Examiner*—Ramon O. Ramirez
*Assistant Examiner*—Kimberly Wood
(74) *Attorney, Agent, or Firm*—Kevin S. Costanza; Seed IP Law Group PLLC (57) ABSTRACT

An apparatus and method for managing cables in a communication rack system having a first upright support member, a second support member spaced apart from the first support member to define an upright plane, a plurality of fastening locations along the first and second support members, an electronic device releasably mounted to the support members at selected fastening locations, and a plurality of cables projecting from a front surface of the electronic device. In one embodiment, a cable management device includes a mounting structure and a support structure. The mounting structure generally has a plurality of universal mounting sites arranged to correspond to the fastening locations along a portion of the first and second support members so that the mounting structure can be releasably affixed to the support members at selected fastening sites. The support structure projects from the mounting structure in a cross-wise support plane transverse to the upright plane and transverse to the first and second support members. The support structure is positioned relative to the mounting structure to support the cables to run at least substantially cross-wise with respect to the first and second support members at a selected elevation outward from the upright plane with respect to the electronic device when the mounting structure is coupled to at least one of the upright support members. The cable management device supports and retains the communication cables either in the front or the rear of the electronic devices from which they project in order to protect the cables and to allow the electronic devices to be stacked closely together. The cable management device can also be adjustable to work with electronic devices of various sizes.

5 Claims, 7 Drawing Sheets

CABLE MANAGEMENT DEVICE

TECHNICAL FIELD

The invention relates to devices for managing cables and other lines in a communication rack. More particularly, the invention relates to devices for supporting and retaining cables in a manner that protects the cables and allows electronic devices to be stacked closely together in the rack.

BACKGROUND OF THE INVENTION

Communication racks and relay racks are used in communication rooms to manage voice and data lines at demarcation points between carriers and users, or at other points in a network. A typical communication rack has two upright rails upon which a number of patch panels and other related electronic devices, such as hubs or routers, are mounted to connect one set of lines to another. The rails are separated by standard distances depending on whether it is a data rack (19 inches) or a telecommunication rack (23 inches). The rails can be exposed, or they can be enclosed in a cabinet or another enclosure to provide better control of the moisture and temperature surrounding the electronic devices. As one example of such a rack, a plurality of patch panels are commonly mounted on the rails of the communication rack to connect an outside line (e.g., a T1 line) from a carrier with a number of individual lines.

A typical patch panel includes a flange for mounting the patch panel to the upright rails of the communication rack, a back panel having one or more horizontal rows of ports for receiving incoming lines, and a front panel having a plurality of jacks for receiving outgoing lines. Each jack in the front panel corresponds to a port in the back panel. The flange projects from the sides of the patch panel to overlap the rails, and the flange has a number of mounting holes corresponding to a pattern of fastening locations along the rails. The patch panel can be mounted to the rack at a selected elevation by aligning the mounting holes of the flange with the fastening locations on the rails at the desired elevation, and then attaching the patch panel to the rails with a plurality of fasteners. A number of panels can be stacked vertically in this manner.

The back panel of the patch panel has a number of ports for receiving the individual lines that have been separated out of a complex line, such as a T1 line. The ports are organized in horizontal rows, and each row commonly has 24 ports. Depending on the number of individual lines that are to be connected to the patch panel, the back panel may have one, two or three rows of ports. A patch panel having three rows of ports is known as a three-unit (3U) patch panel, and it occupies approximately 5.25 vertical inches of rack space. A two-unit (2U) device has two rows of ports and occupies approximately 3.5" of vertical rack space. Likewise, a one-unit (1U) device has one row of ports and occupies approximately 1.75" of vertical rack space.

The front panel of the patch panel has one or more horizontal rows of jacks that correspond to the rows of ports on the back panel. Outgoing cables are easily connected to and disconnected from the appropriate jacks on the front panel to couple lines connected to the back panel to desired devices. Thus, as the individual devices are moved to different locations throughout a building, the devices may be coupled to the same lines on the back panel by switching the outgoing cables to the appropriate jacks of the front panel.

In operation, a first group of patch panels commonly manages the primary lines coming into a communications room, and a second group of patch panels manages the secondary lines going to specific locations in a building. By systematically connecting a patch cord between a specific jack of the first group of patch panels and a selected jack of the second group of patch panels, one line can be connected to another line in the building. The patch cords projecting from the jacks on the first patch panel are routed to another location on the rack or to another rack to be connected to the second patch panel.

A number of problems exist with current systems for managing cables in communication racks. As a general matter, most communication cables may not perform efficiently if they are crimped or bent tighter than a minimum bend radius. This is particularly true with fiber optic cables because sharp bends affect the optical properties of the cables. For example, in 3U patch panels in which the rows of cables hang from the patch panel, the collective weight of the stacked cables causes the lower rows of cables to bend at a tighter radius than the upper rows of cables. The lower rows of cables may consequently experience cross-talk or other problems. To prevent this from happening, installation technicians often mount each patch panel to a rack to provide enough vertical space above and below the patch panels to run the cables between the patch panels. As a result, a typical communication rack with approximately 48U of total space will have between 20U and 30U of space used for cable management and only about 18U–28U of space occupied by patch panels or other equipment.

A significant problem with this type of cable management system is that the vertical rack space occupied by the cables reduces the number of patch panels and other electric devices that can be mounted to the rack. The additional number of lines required for fax machines and modems is just exacerbating this problem causing communication racks to quickly fill to capacity. For example, because conventional cable management techniques required 20–30U of vertical rack space for supporting the cables, many communication racks are already at full capacity and cannot hold additional electronic devices. In many applications, therefore, the installers must purchase new racks or even build a larger communications room. Thus, conventional cable management techniques can present significant problems for businesses and other users that need to reconfigure or install new communications equipment.

Futhermore, merely using additional vertical rack space for adding new patch panels is difficult when the cables hang vertically in front of the patch panels and completely obstruct the technician's view of the front of the rack. To insert additional patch panels, technicians must sometimes disconnect cables. Disconnecting cables, however, is highly undesirable because it interrupts phone or data lines, and it creates a risk that the line will be incorrectly reconnected. Debugging a complex communications rack is complicated and time-consuming, and can be extremely expensive. Thus, reconfiguring or otherwise retrofitting communication racks that have some excess capacity is also difficult.

SUMMARY OF THE INVENTION

The present invention relates to cable management devices for supporting and retaining communication cables projecting from electronic devices to protect the cables and to allow the electronic devices to be stacked closely together. Several embodiments of cable management devices are particularly useful for managing cables in racks in which the electronic devices are attached to first and second upright support members that define an upright plane at either the front or the rear of the electronic devices. In one embodiment, the cable management device includes one or more universal mounting structures for releasably coupling the cable management device to the rack, and a support structure for supporting and retaining the cables either in front of or behind the electronic device.

The mounting structure preferably has a first attachment portion to couple the cable management device to the first upright support member of the communication rack, and a second attachment portion to couple the cable management device to the second upright support member of the communication rack. The mounting structure is configured to be releasably coupled to at least one of the first and second upright support members at selected elevations at a location that is proximate to the elevation of the electronic device.

The support structure projects from the mounting structure in a support plane transverse to the upright plane for supporting and retaining the cables either in front of or behind the electronic devices. The support structure can have a first extension portion that projects outward from the first attachment portion, and a second extension portion that projects outward from the second attachment portion. The first and second extension portions generally project from the attachment portions in the support plane away from the electronic devices in the rack. A cross-member can extend between the first and second extension portions, and the cross-member can have one or more retaining members to retain the cables to run at least substantially transverse with respect to the first and second upright support members at a location spaced outward from the upright plane between the first and second support members.

During operation, the cable management device is coupled to one or both of the support members by bolts, clamps or other types of releasable fasteners. The cables projecting from the electronic device are releasably retained in a transverse direction with respect to the first and second upright support members. Because the cables are retained cross-wise either in front of or behind the electronic devices, the cables no longer need to be stored in the vertical rack spaces between the electronic devices. This additional vertical rack space allows the electronic devices to be stacked closer together and, therefore, allows more electronic devices to be retained on a single communication rack. The mounting structure can be configured for use with a variety of electronic devices, including 1U, 2U and 3U patch panels.

In another embodiment, the mounting structure has a plurality of universal mounting sites arranged to correspond to a number of fastening locations along a portion of the support member so that the mounting structure can be releasably affixed to the support members at a selected elevation. For example, the mounting sites can be elongated slots that are inserted behind a head on the fasteners from the side when the fastener is partially removed from the fastening location.

DETAILED DESCRIPTION OF THE INVENTION

The present invention is generally directed toward cable management devices that can be releasably mounted to a communication rack at selected elevations to support and retain a plurality of cables projecting from the patch panels or other electronic devices in the rack. Several embodiments of the cable management devices allow the electronic devices to be stored in close proximity with each other in the vertical rack space that is conventionally used to support the cables between adjacent patch panels. As a result, a rack with the cable management devices of the present invention can generally hold more electronic devices than a conventional rack without the cable management devices. Many specific details of certain embodiments of the invention are set forth in the following description and in FIGS. 1–8 to provide a thorough understanding of such embodiments. One skilled in the art, however, will understand that the present invention may have additional embodiments, or that the invention may be practiced without several of the details described in the following description.

Figure 1:
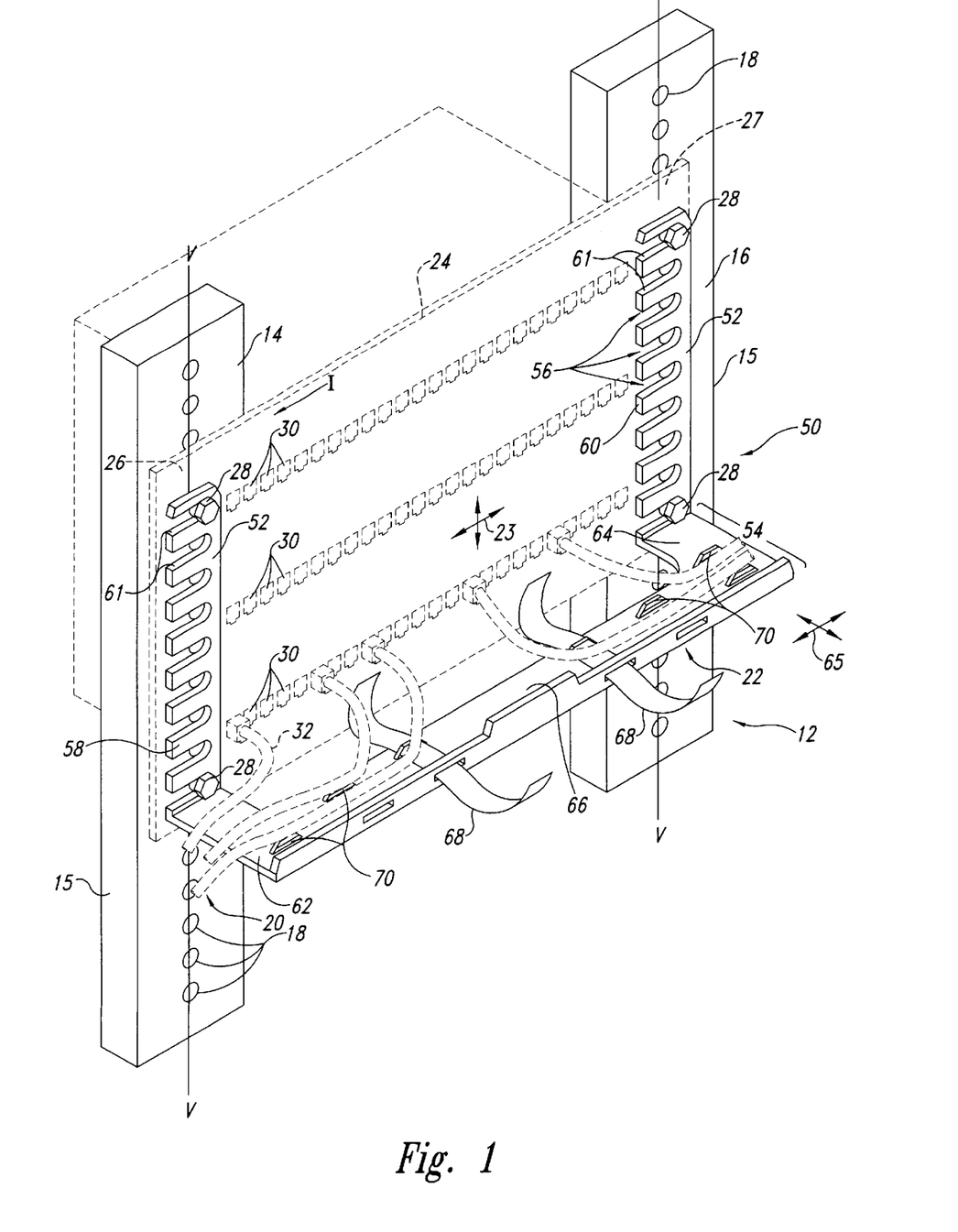
FIG. 1 is an isometric view of a cable management device according to one embodiment of the present invention configured for use with a three-unit patch panel shown in broken lines on a communication rack.
Figure 2:
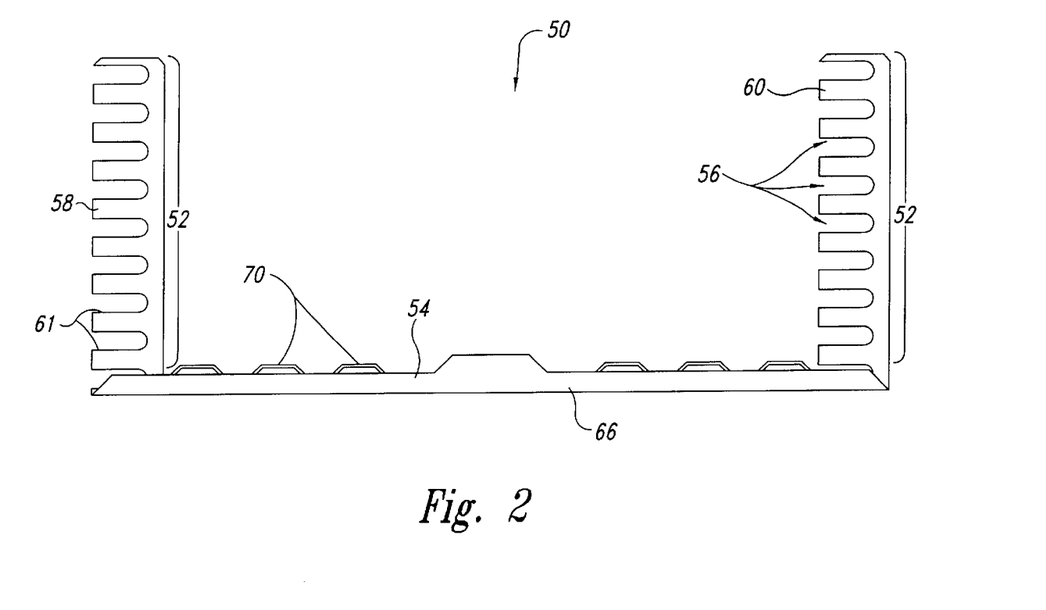
FIG. 2 is a front elevation view of the cable management device of FIG. 1.
Figure 3:
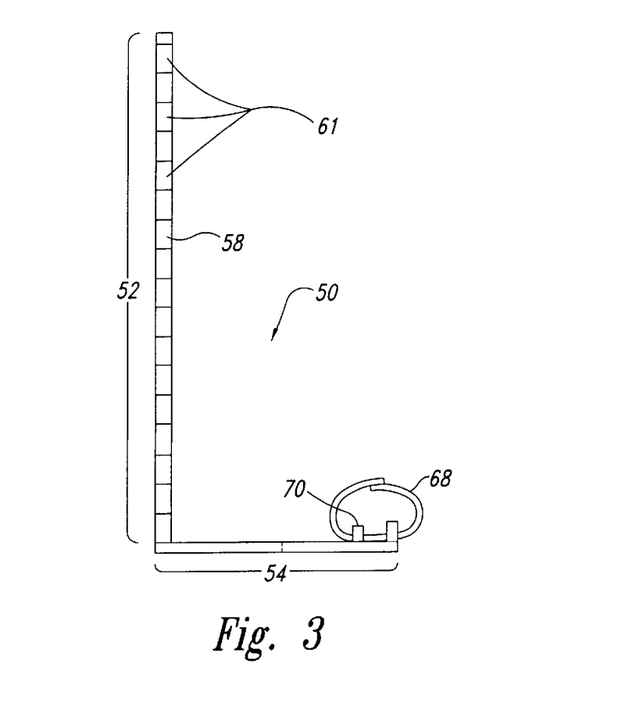
FIG. 3 is a side elevation view of the cable management device of FIG. 1.

FIGS. 1–3 illustrate a cable management device 50 attached to a communication rack 12 that includes a first upright support member 14 and a second upright support member 16 spaced apart from the first support member 14 by a width according to industry protocol. The first and second support members 14 and 16 have a plurality of fastening locations 18 spaced along first and second mounting surfaces 20 and 22, respectively. In the illustrated communication rack 12, the first and second mounting surfaces 20 and 22 are coplanar to define an upright mounting plane 23. The communication rack 12 generally has one set of first and second front upright support members and one set of first and second rear upright support members. The first and second support members 14 and 16 shown in FIG. 1 are representative of either a set of front upright support members or a set of rear upright support members. The cable management devices will thus be described below in relationship to a set of front upright support members with the understanding that they operate in at least substantially the same manner on a set of rear support members.

A patch panel 24 is mounted at a selected elevation to the communication rack 12. To mount the patch panel 24, a first flange 26 on one side of the patch panel 24 is placed against the first mounting surface 20, and a second flange 27 on an opposite side of the patch panel 24 is placed against the second mounting surface 22. A plurality of mounting holes (not shown) on the flanges 26 and 27 are aligned with the fastening locations 18 that correspond to the selected elevation. A plurality of releasable fasteners 28 extend through the mounting holes in the first and second flanges 26 and 27 to engage the fastening locations 18. As will be described below, when the cable management device 50 is in place, the releasable fasteners 28 are tightened to rigidly retain the patch panel 24 to the rack 12. In the illustrated embodiment, the fasteners 28 are bolts, screws or other suitable devices, and the fastening locations 18 are threaded holes or other types of fastening devices.

The cable management device 50 includes a mounting structure 52 positioned parallel to the mounting plane 23 for coupling the cable management device 50 to the communication rack 12, and a support structure 54 projecting from the mounting structure 52 in a plane transverse to the mounting plane 23 to support and retain a number of cables 32 outward from the patch panel 24. For the purposes of the following description, the term "transverse" means that two items extend relative to one another at any angle other than zero such that the two items are not parallel to one another. In the illustrated embodiment, the cable management device 50 is punched from a single sheet of material, such as metal, and it is bent to create the mounting structure 52 and the support structure 54. The cable management device 50 can be made out of other materials, and it can be bent or otherwise formed in a manner appropriate for the given material. For example, the cable management device can be molded from a plastic.

The mounting structure 52 of the illustrated embodiment has a first attachment portion 58 and a second attachment portion 60. The first attachment portion 58 is preferably flat, or at least substantially planar, to engage either the first mounting surface 20 of the first support member 14 or the first flange 26 of the patch panel 24. Similarly, the second attachment portion 60 is also flat, or at least substantially planar, to engage either the second mounting surface 22 of the second support member 16 or the second flange 27 of the patch panel 24. The attachment portions 58 and 60 are generally elongated along a vertical dimension V—V, and they have a plurality of universal mounting sites 56 spaced apart from one another along the vertical dimension. The mounting sites 56 are preferably slots 61 or other apertures arranged to correspond with the plurality of fastening locations 18 along the first and second mounting surfaces 20 and 22 of the first and second support members 14 and 16. In one embodiment, the mounting structure 52 is thin enough to be mounted directly against the flanges 26 and 27 of the patch panel 24 using the fasteners 28, and the slots 61 extend transversely to the vertical dimension with an open end at one edge of the corresponding attachment portions 58 and 60 to a closed end at an intermediate point in the attachment portions 58 and 60. The slots 61 in the first and second attachment portions 58 and 60 preferably have an open end at a common edge of the attachment portions so that the cable management device 50 may be coupled to the rack 12 by loosening the fasteners 28 and moving the cable management device 50 laterally in the direction of arrow I to position the shafts of the fasteners 28 in the corresponding slots 61. The cable management device 50 can be coupled to the upright support members 14 and 16 with bolts or other screw-type fasteners, or they can be mounted directly to one or both of the support members 14 and 16 with other types of fasteners. For example, the cable management device 50 can be coupled to the support members 14 and 16 using clamps, brackets, adhesives or VELCRO.

The support structure 54 preferably projects from the mounting structure 52 in a support plane 65 transverse to the mounting plane 23. For example, the support structure 54 can be perpendicular to the mounting structure 52 to project perpendicularly from the mounting plane 23. In the illustrated embodiment, the support structure 54 has a first extension portion 62 projecting from the first attachment portion 58 and a second extension portion 64 projecting from the second attachment portion 60. An elongated cross-member 66 extends between the first and second extension portions 62 and 64. The cross-member 66 preferably extends between the ends of the first and second extension portions 62 and 64 that are spaced apart from the attachment portions 58 and 60. In this embodiment, the extension portions 62 and 64 separate the cross-member 66 from the mounting plane 23 to allow cables 32 to pass between the patch panel 24 and the cable management device 50.

The cable management device 50 also has a plurality of releasable retaining members 68 attached to the cross-member 66 for retaining the cables 32 projecting from the patch panel 24. The retaining members 68 are attached to the cross-member 66 by a plurality of anchor elements 70, such as small eyelets spaced apart from one another along the cross-member 66. The retaining members 68 are preferably spaced along the length of the cross-member 66 to roughly correspond to the jacks 30 spaced across the patch panel 24. This arrangement can prevent the cables 32 from being bent too tightly as they extend between the jacks 30 and the correspondingly positioned retaining members 68. In the illustrated embodiment, the retaining members 68 are flexible straps having hooks on at least a portion of one side and mating loops on at least a portion of the other side (e.g., VELCRO) so that overlapping one end of the strap over the other end causes the strap to become releasably fixed to itself. The retaining members 68 can also be belts or straps with a buckle, wire ties, or similar devices.

The cable management device 50 can be installed either before or after the patch panel 24 has been attached to the rack 12. If the patch panel 24 has not been installed on the rack, then the cable management device 50 can be mounted directly to the first and second mounting surfaces 20 and 22 of the first and second support members 14 and 16. The pattern of the mounting sites 56 on the first and second attachment portions 58 and 60 matches, in location, the pattern of the fastening locations 18 on the first and second support members 14 and 16. The cable management device 50 can therefore be mounted to the rack 12 by first aligning the mounting sites 56 with the fastening locations 18 at a selected elevation, and then by inserting the fasteners 28 through the mounting sites 56 until they engage the fastening locations 18. The fasteners 28 can be tightened to couple the cable management device 50 to the rack 12.

If the patch panel has already been attached to the rack 12, the cable management device 50 can be attached directly over the first and second flanges 26 and 27 of the patch panel 24 using the same fasteners that retain the patch panel 24 to the rack 12. If the cables 32 have already been connected to the patch panel 24, the cable management device 50 can be inserted behind the hanging cables 32 from the side. The slots 61 in the mounting structures 58 and 60, for example, can be positioned directly to the side of the fasteners 28 with the fasteners 28 in position at the open end of the slots 61. The fasteners 28 can then be loosened to a point where the open end of a slot 61 can be inserted behind a head of the corresponding fastener 28. Once a shaft of a fastener 28 is positioned within the corresponding slot 61, the fastener can be tightened to rigidly retain the cable management device 50 to the communication rack 12.

After the cable management device 50 is coupled to the support members 14 and 16, the cables 32 are laid along the cross-member 66. The cables 32 initially project outward from the patch panel 24 in a direction substantially perpendicular to the flange 26 of the patch panel 24 to reduce the likelihood of damage caused by bending the cables 32 too tightly. The cables 32 are then bent into alignment with the cross-member 66. The cables 32 on the left side of the patch panel 24 preferably run along the cross-member 66 toward the first extension portion 62, and the cables 32 on the right side of the patch panel 24 preferably run along the cross-member 66 toward the second extension portion 64. The cables 32, therefore, preferably run cross-wise with respect to the first and second upright support members 14 and 16 in the support plane 65 when supported by the cable management device. The retaining members 68 preferably releasably retain the cables 32 to the cross-member 66 so that the cables 32 are not bent tighter than a minimum bend radius for the particular type of cable. Once the cables 32 are laid on the cross-member 66 and directed to a side of the rack 12, the portion of the cables 32 extending around the sides 15 may extend up or down the support members 14 and 16.

The preferred embodiment of the cable management device 50 provides several advantages for managing the cables 32 that extend from patch panels 24 and other electronic devices retained in the communication rack 12. For example, because the cable management device 50 supports and retains the cables 32 cross-wise with respect to a longitudinal axis of the upright support members 14 and 16 either in front of or behind the patch panel 24, the cables 32 do not need to be supported or positioned in the vertical rack space either above or below the patch panel 24. This clears the vertical rack space between adjacent patch panels 24, allowing the patch panels to be stacked close together. As a result, the cable management device 50 can increase the vertical rack space available for electronic devices to make communication rooms more efficient.

The cable management device 50 can be used for both new installations and retrofit applications. During a new installation, the cable management device 50 allows the cables 32 to be directed to the sides 15 of the rack 12 so that the front or real of the communication rack 12 is not obstructed by hanging cables. As a result, the cable management device provides better visibility and access to the rack to make subsequent installations quicker and easier.

When retrofitting an existing communication rack 12, the cable management device 50 can also be inserted between an existing communication rack and the cables projecting from such a rack without disconnecting the cables 32. The cable management device 50 can accordingly eliminate periods of down time caused by disconnecting cables 32 during retrofitting. More importantly, because the cables 32 are not disconnected, they do not need to be re-connected, which can eliminate the possibility that the cables 32 will be re-connected incorrectly. The cable management device 50, therefore, can significantly save time and costs involved in de-bugging an incorrectly re-connected communication system.

The cable management device 50 is also expected to reduce cross-talk and other problems associated with bending the cables 32 compared to conventional cable management systems. More particularly, because the cross-member 66 on the cable management device 50 is separated from the mounting plane 23, the cables 32 projecting from the patch panels 24 are retained at a distance from the jacks 30 that allows the cables 32 to bend over a large radius. The gradual bend radius of the cables 32 is accordingly less likely to adversely affect the perfonmance of the cables 32. In addition, the cable management device 50 uses flexible, re-usable, retaining members 68 that can loosely retain the cables 32. The cable management device 50, therefore, is less likely to crimp the cables 32 at the retaining points.

Figure 4:
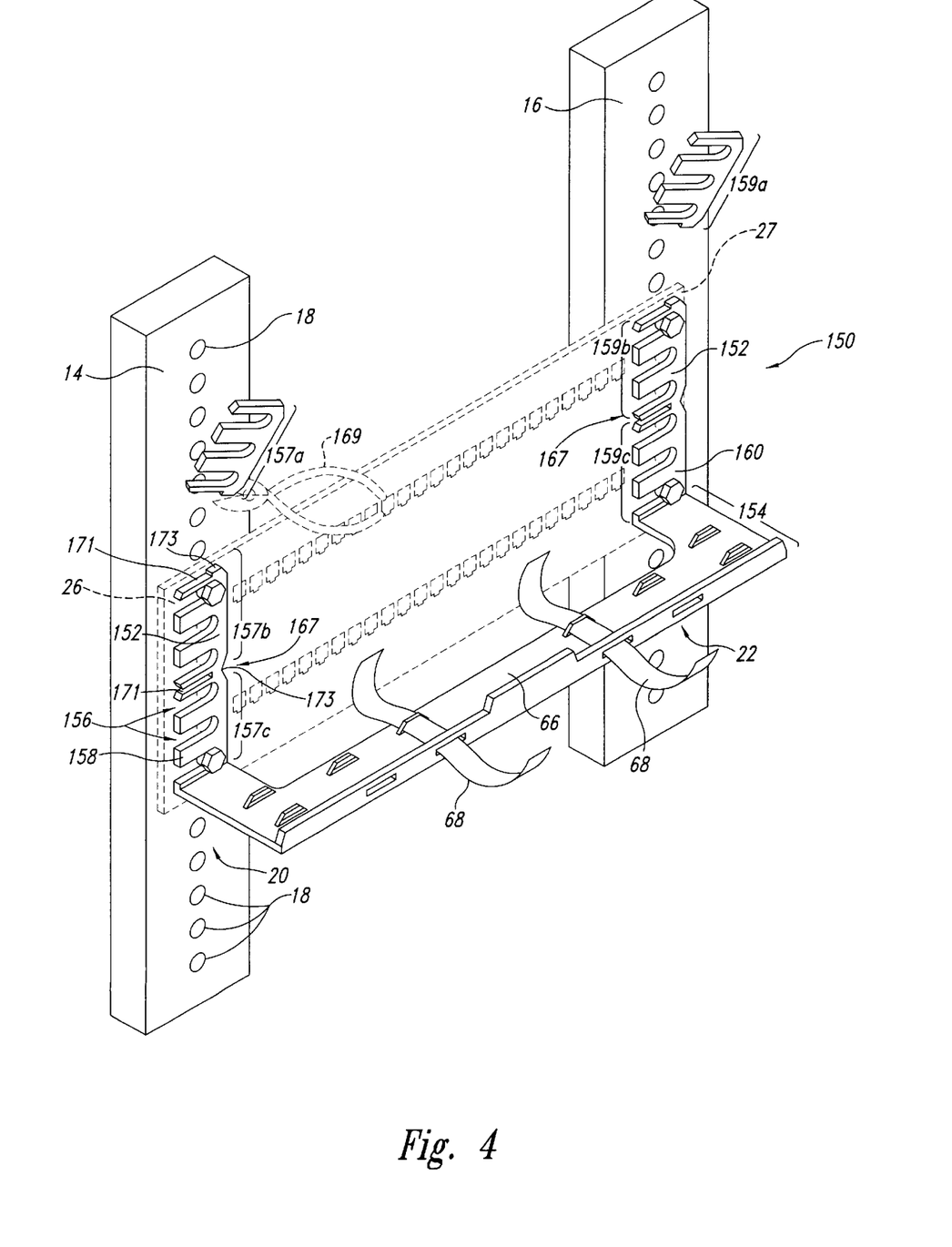
FIG. 4 is an isometiic view of another cable management device according to another embodiment of the present invention configured for use with a two-unit patch panel on a communication rack.
Figure 5:
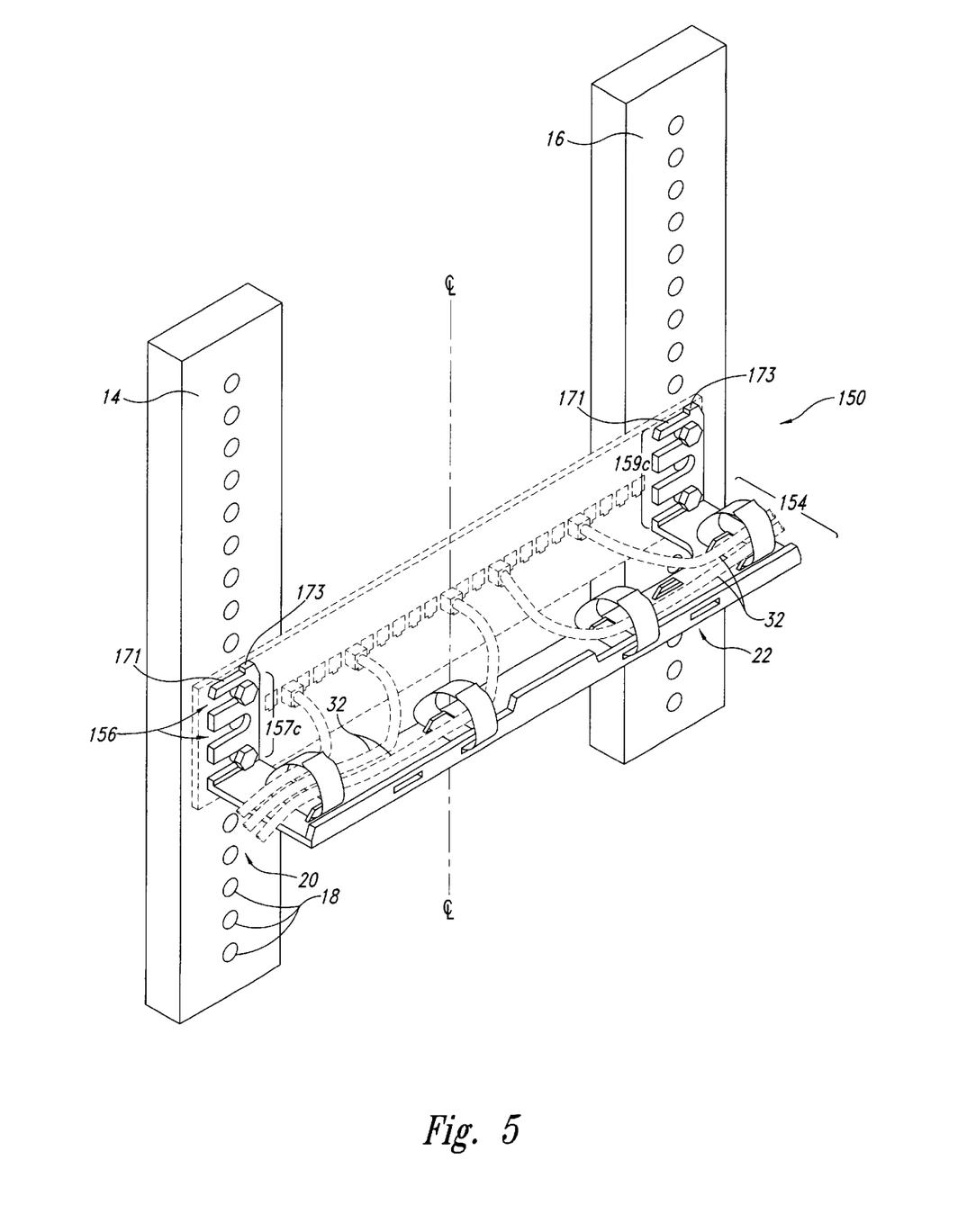
FIG. 5 is an isometric view of the cable management device of FIG. 4 modified to retain cables projecting from a one-unit patch panel on a communication rack.
Figure 6:
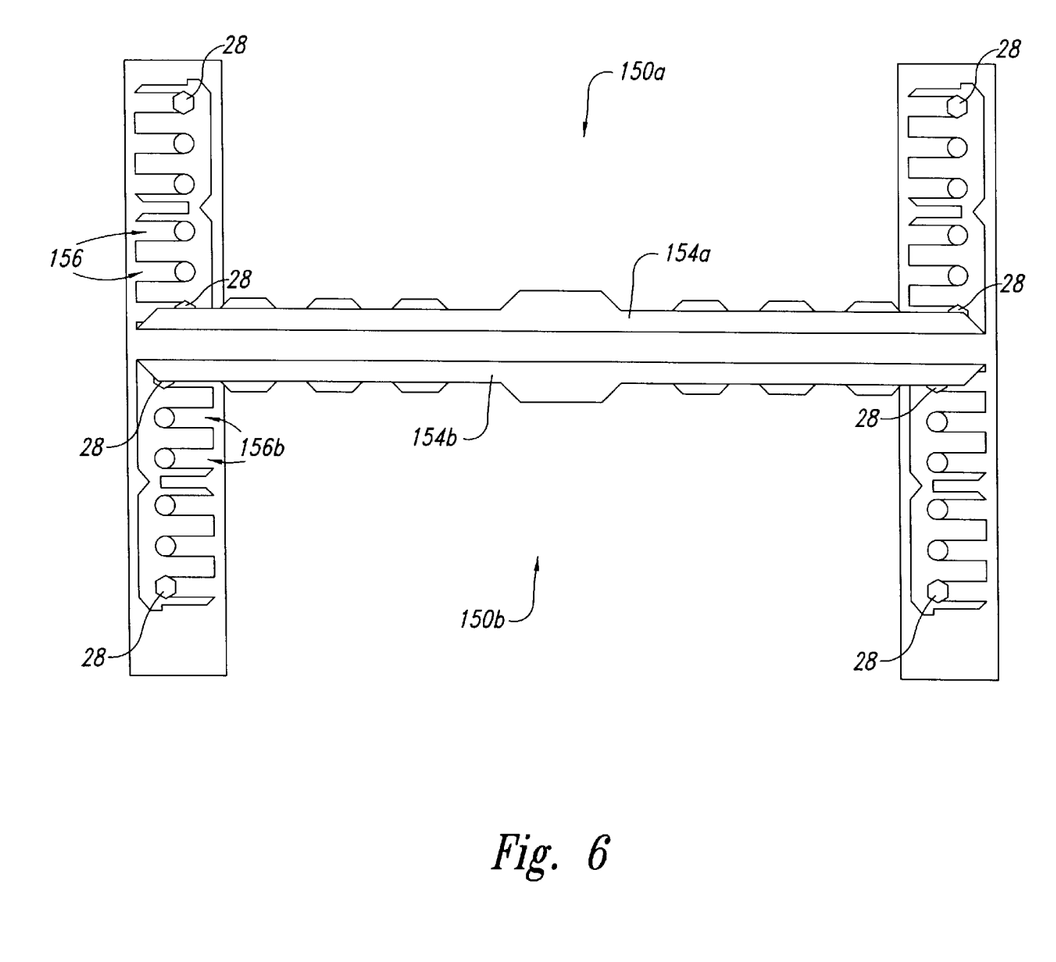
FIG. 6 is a front elevation view of two cable management devices according to another embodiment of the present invention configured for use with a four-unit patch panel on a communication rack.

FIGS. 4–6 illustrate another cable management device 150 according to another embodiment of the present invention. In this embodiment, the cable management device 150 has a mounting structure 152 and a support structure 154. The mounting structure 152 has a first attachment portion 158 and a second attachment portion 160 for attaching the cable management device 150 to the first and second support members 14 and 16 of the communication rack 12. The first and second attachment portions 158 and 160 have a plurality of universal mounting sites 156 arranged to correspond with a plurality of fastening locations 18 along the first and second support members 14 and 16.

The first attachment portion 158 is divided into a plurality of mounting units 157a–157c, and the second mounting portion 160 is divided into a corresponding plurality of mounting units 159a–159c. Each mounting unit corresponds to 1U of vertical space of the traditional communication rack 12 (approximately 1.75"). Between each mounting unit is a break-away location 167 that is strong enough to maintain the structural integrity of the attachment portions 158 and 160 when the cable management device 150 is coupled to the rack, but can be severed during installation to adjust the lengths of the attachment portions 158 and 160. In the illustrated embodiment, the first and second attachment portions 158 and 160 are initially approximately 5.25 inches in length (i.e., 3U) and have two break-away locations 167. Each break-away location 167 preferably has a deep channel 171 and a reduced size neck 173 extending between two adjacent mounting units (e.g., 157a and 157b). The channel 171 begins at one edge of the attachment portions 158 and 160, extends in a transverse direction with respect to the edge across a portion of the attachment portions 158 and 160, and terminates at the neck 173. The break-away locations 167 can also be in the form of grooves, notches, perforations or other suitable structures that can be readily severed.

The cable management device 150 can be adjusted to correspond to a variety of patch panels 24 that occupy 1U, 2U or 3U of vertical space on the rack. Prior to being severed at one of the break-away locations 167, the illustrated cable management device 150 is suitable for use with a 3U electronic device. As shown in FIG. 4, the cable management device 150 can be modified to conform to a 2U patch panel 24 by removing mounting units 157a and 159a. To do so, the attachment portions are first fastened to the patch panel 24 with the fasteners 28. The mounting units 157a and 159a that project beyond the two-unit patch panel 24 are either broken off with a pair of pliers 169 or cut off with a cutting tool. Similarly, as shown in FIG. 5, the cable management device 150 can be modified to conform to a 1U electronic device by further removing mounting units 157b and 159b in the same manner.

FIG. 6 shows another application using two cable management devices 150a and 150b configured to support the cables from a two-unit patch panel 24. The cable management device 150a is mounted against the top patch panel 24 as described above. The cable management device 150b is inverted and mounted below the top cable management device 150a with its support structure 154b adjacent to the support structure 154a of the top cable management device 150a. Because the mounting sites 156 are universal and arranged to correspond to the pattern of the fastening locations 18 on the communication rack 12, the bottom cable management device 150b can be inverted and the mounting sites 156b will still be aligned with the fastening locations 18. During use, the top cable management device 150a is used as described above, while the bottom cable management device 150*b* suspends the cables 32 from above in a manner that is symmetrical with the top cable management device 150*a*.

Figure 7:
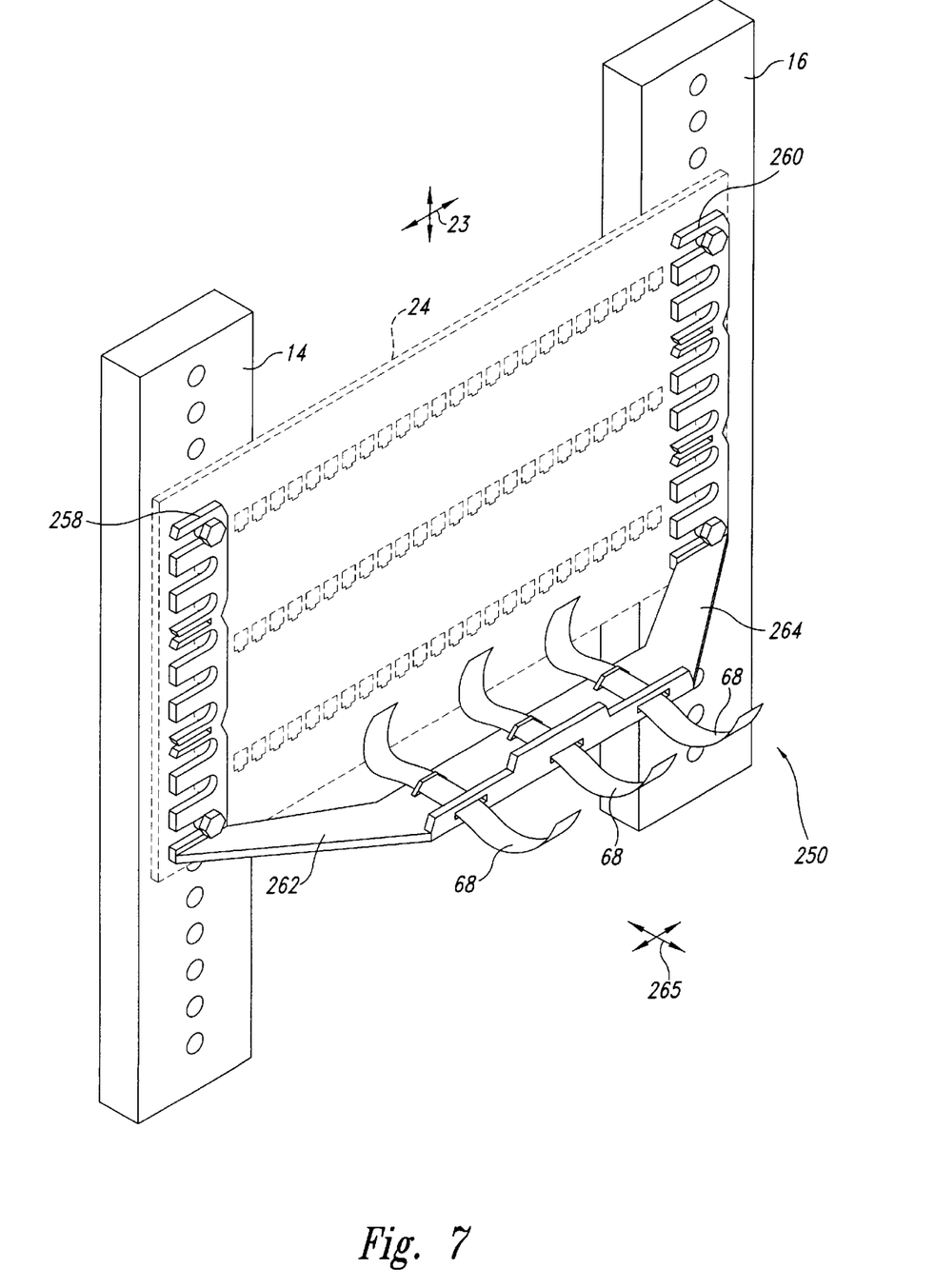
FIG. 7 is an isometric view of yet another cable management device according to yet another embodiment of the present invention.

FIG. 7 illustrates yet another embodiment of a cable management device 250 of the present invention. The cable management device 250 has a first attachment portion 258 and a second attachment portion 260 for attaching the cable management device 250 to the first and second support members 14 and 16 of the communication rack 12. A first extension portion 262 and a second extension portion 264 project from the first and second attachment portions 258 and 260, respectively, in a support plane 265 transverse to the mounting plane 23. Additionally, the first and second extension portions 262 and 264 converge toward one another with increasing distance from the support members 14 and 16.

Figure 8:
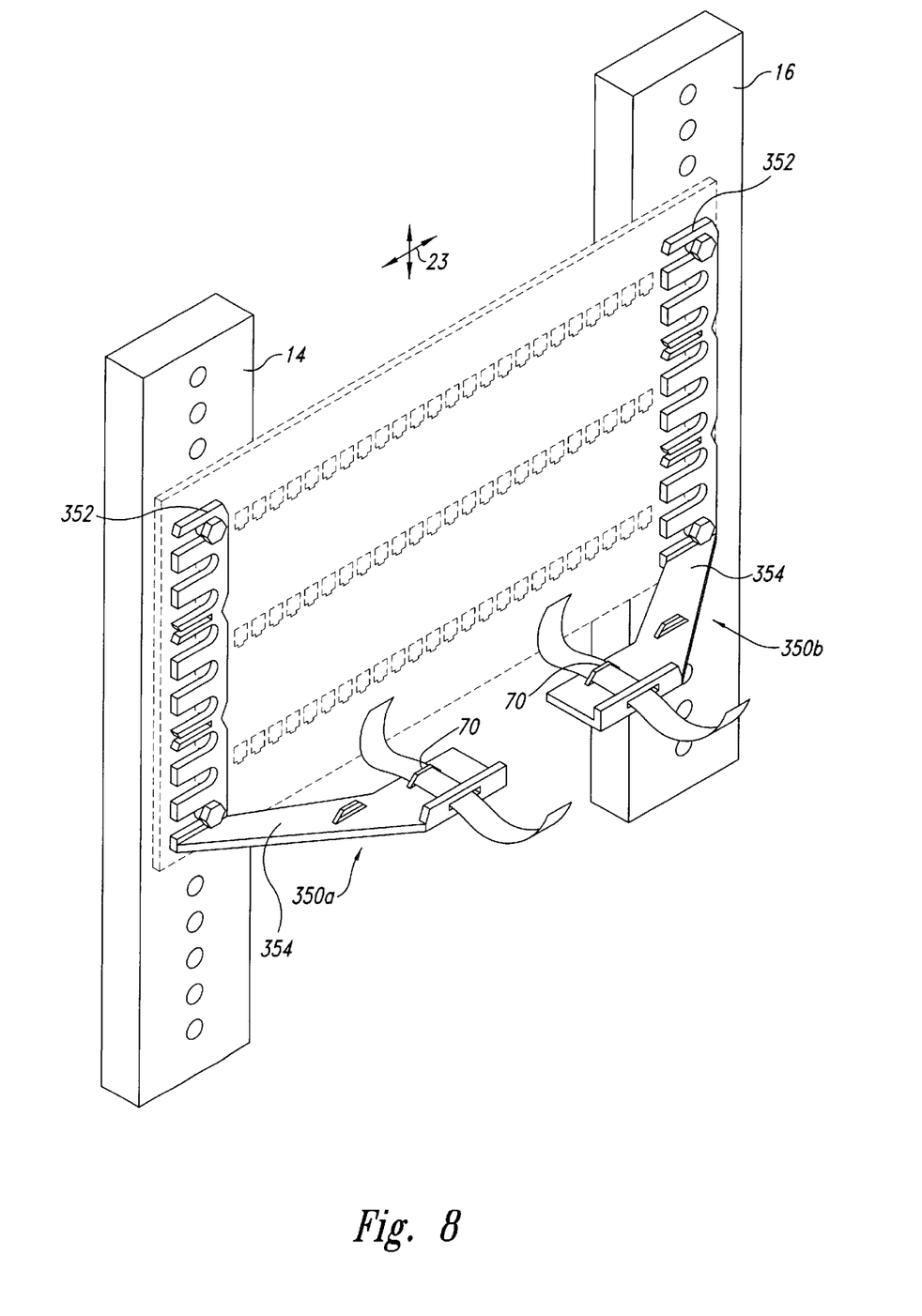
FIG. 8 is a top plan view of two cable management devices according to still another embodiment of the present invention.

FIG. 8 shows a cable management device 350*a* according to still another embodiment of the present invention. The cable management device 350a can be mounted onto the communication rack 12 either alone or in combination with another cable management device 350*b*, as shown in FIG. 8. The cable management devices 350*a* and 350*b* each have a mounting structure 352 and a support structure 354 projecting from the mounting structure 352. The support structure 354 on the left cable management device 350*a* projects from the mounting structure 352 at an angle toward the opposite support member 16. Likewise, the support structure 354 on the right cable management device 350*b* projects from the mounting structure 352 at an angle toward the opposite support member 14. The angle between the support structures 354 of the left and right cable management devices 350*a* and 350*b* can vary according to the particular application.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A cable management device for mounting on a communication rack, the communication rack having a first upright support member and a second upright support member for retaining one or more electronic devices, the first and second upright support members each having a substantially planar face that together define a mounting plane of the communication rack, the faces of the first and second upright support members each having a plurality of fastening locations for engaging a plurality of fasteners to retain the electronic devices to the communication rack, the cable management device comprising:

a mounting structure including a first attachment portion and a second attachment portion spaced apart from the first attachment portion, the first and second attachment portions being substantially coplanar and simultaneously alignable with the first and second upright support members, respectively, the first attachment portion having a first edge and the second attachment portion having a second edge, the first and second attachment portions each having at least one mounting slot extending transversely from the first and second edges, respectively, the mounting slots being alignable with the fastening locations on the faces of the first and second upright support members such that the cable management device can be releasably coupled by the fasteners to the communication rack; and a support structure for supporting a plurality of cables projecting from one of the electronic devices retained by the communication rack, the support structure comprising a first extension portion projecting from the first attachment portion, a second extension portion projecting from the second attachment portion, and a cross-member having a first end attached to the first extension portion and a second end attached to the second extension portion, the first extension portion, the second extension portion and the cross-member collectively defining a support plane, the support plane being aligned to be transverse to the mounting plane of the communication rack when the cable management device is mounted thereto, the cross-member having a substantially flat support surface such that the plurality of cables can be supported thereon, the support surface having a plurality of apertures each sized and shaped for selectively receiving a releasable fastener such that the plurality of cables can be retained to the support surface and guided along the cross-member.

2. The cable management device of claim 1 wherein the first and second attachment portions of the mounting structure each have a length for extending along a longitudinal dimension of the first and second upright support members, respectively, and each of the first and second attachment portions further comprises a plurality of mounting units along the length of the first and second attachment portions in which adjacent mounting units are attached to one another at a break-away location, each break-away location comprising a channel and a neck, the channel extending transversely with respect to the first and second edges, respectively, across a portion of the mounting structure, the neck being a reduced sized portion of the first and second attachment portions connecting adjacent mounting units, and the neck being readily bendable to be manually broken for shortening the mounting structure.

3. The cable management device of claim 1 wherein the support structure further comprises a releasable fastener for attaching the cables to the support structure.

4. The cable management device of claim 3 wherein the releasable fastener comprises an elongated, flexible strap having a first end, a second end opposite the first end, a first side with a connecting portion having one of loops or hooks, and a second side with a connecting portion having the other of loops or hooks, the strap being configured to wrap around a bundle of cables to engage the loops or hooks on the first side with the loops or hooks on the second side for releasably retaining the cables to the support structure.

5. The cable management device of claim 1 wherein the support structure projects perpendicularly from the mounting structure.

* * * * *